United States Patent
Yamagishi et al.

(10) Patent No.: US 8,163,852 B2
(45) Date of Patent: Apr. 24, 2012

(54) RESIST POLYMER AND METHOD FOR PRODUCING THE POLYMER

(75) Inventors: Takanori Yamagishi, Funabashi (JP); Tomo Oikawa, Ichihara (JP); Ichiro Kato, Chiba (JP); Kazuhiko Mizuno, Sodegaura (JP); Satoshi Yamaguchi, Ichihara (JP)

(73) Assignee: Maruzen Petrochemical Co., Ltd., Tokyo (JP)

( * ) Notice: Subject to any disclaimer, the term of this patent is extended or adjusted under 35 U.S.C. 154(b) by 0 days.

(21) Appl. No.: 12/319,492

(22) Filed: Jan. 8, 2009

(65) Prior Publication Data

US 2009/0123868 A1 May 14, 2009

Related U.S. Application Data

(60) Continuation of application No. 11/203,256, filed on Aug. 12, 2005, now abandoned, which is a division of application No. 10/775,695, filed on Feb. 10, 2004, now abandoned.

(30) Foreign Application Priority Data

Feb. 20, 2003 (JP) .................................. 2003-042536

(51) Int. Cl.
*C08F 2/00* (2006.01)
(52) U.S. Cl. ............... 526/79; 526/82; 526/87; 526/319
(58) Field of Classification Search ............... 526/79, 526/82, 87, 319; 430/270.1, 286.1, 905, 430/907, 910
See application file for complete search history.

(56) References Cited

U.S. PATENT DOCUMENTS

| 6,770,417 B2 * | 8/2004 | Nozaki et al. | 430/270.1 |
| 6,800,414 B2 * | 10/2004 | Nishimura et al. | 430/270.1 |
| 6,841,331 B2 * | 1/2005 | Barclay et al. | 430/270.1 |
| 2002/0009668 A1 | 1/2002 | Nishimura et al. | 430/270.1 |
| 2002/0058197 A1 | 5/2002 | Nozaki et al. | 430/270.1 |
| 2003/0175620 A1 * | 9/2003 | Toishi et al. | 430/280.1 |
| 2003/0215739 A1 | 11/2003 | Harada et al. | 430/270.1 |

FOREIGN PATENT DOCUMENTS

| JP | 59-45439 | 3/1984 |
| JP | 62-115440 | 5/1987 |
| JP | 3-223860 | 10/1991 |
| JP | 4-104251 | 4/1992 |
| JP | 4-219757 | 8/1992 |
| JP | 4-269754 | 9/1992 |
| JP | 5-113667 | 5/1993 |
| JP | 7-209868 | 1/1995 |
| JP | 9-73173 | 3/1997 |
| JP | 10-239846 | 9/1998 |
| JP | 11-65120 | 3/1999 |
| JP | 11-295894 | 10/1999 |
| JP | 2001-109153 | 4/2001 |
| JP | 2002-6501 | 1/2002 |
| WO | WO 99/50322 | 10/1999 |

* cited by examiner

*Primary Examiner* — Edward Cain

(57) ABSTRACT

Solving problems in the prior art, provided are a resist polymer which is small in lot-to-lot, reactor-to-reactor and scale-to-scale variations, and contains no high polymer, is excellent in solubility and storage stability, and is suitable for fine pattern formation, and a method for production thereof. The present invention provides the resist polymer at least having a repeating unit having a structure which is decomposed by an acid to become soluble in an alkali developer and a repeating unit having a polar group to enhance adhesion to a substrate, characterized in that a peak area of a high molecular weight component (high polymer) with molecular weight of 100,000 or more is 0.1% or less based on an entire peak area in a molecular weight distribution determined, by gel permeation chromatography (GPC).

1 Claim, No Drawings

RESIST POLYMER AND METHOD FOR PRODUCING THE POLYMER

RELATED APPLICATIONS

This application is a Continuation of U.S. patent application Ser. No. 11/203,256, filed Aug. 12, 2005 now abandoned, for RESIST POLYMER AND METHOD FOR PRODUCING THE RESIST POLYMER which is a Division of U.S. patent application Ser. No. 10/775,695, filed Feb. 10, 2004 now abandoned, entitled RESIST POLYMER AND METHOD FOR PRODUCING THE RESIST POLYMER, now abandoned.

BACKGROUND OF THE INVENTION

1. Field of the Invention

The present invention relates to a resist polymer used for the production of semiconductors and a method for the production thereof. More particularly, the present invention relates to the resist polymer, which is suitable for microfabrication using various radiations such as far ultraviolet ray, X-ray and electron beam, and excellent in storage stability, and the method for production thereof.

2. Description of Related Art

In semiconductor lithography, the formation of finer patterns has been required in conjunction with increase of integration degree. It is, essential for micropatterning techniques to make a wavelength of light source shorter. Currently, the lithography by krypton fluoride (KrF) excimer laser (wavelength 248 nm) has become a mainstream, and the micropatterning technique of 100 nm linewidth or less by argon fluoride (ArF) excimer laser (wavelength 193 nm) is coming into practical use. The micropatterning techniques using fluorine dimer ($F_2$) excimer laser (wavelength 157 nm), extreme-ultraviolet ray (EUV), X-ray, electron beam, and the like are in developmental stages.

The resist polymer used for these lithography technologies has essentially a repeating unit having a non-polar substitute which is decomposed by an acid and becomes soluble in an alkali developer and a repeating unit having a polar group to enhance adhesion to a semiconductor substrate. And if it is necessary, the resist polymer is comprising a repeating unit having non-polar substitutes to regulate solubility in a resist solvent or the alkali developer. As these repeating units, for example, in the KrF lithography, hydroxystyrenes and derivatives thereof have been primarily used, and in the ArF lithography, (meth)acrylates and derivatives-thereof and the like have been considered because the hydroxystyrenes absorb the light with a wavelength of 193 nm.

As specific examples of such resist polymers, copolymers of (meth) acrylic monomer with styrene type monomer (see e.g., Patent References 1 to 4), polymers containing hydroxystyrene which is partially protected with acetal (see e.g., Patent References 5 to 8) and the like are known in the KrF lithography, and copolymers of (meth) acrylic monomer having lactone structure (see e.g., Patent references 9 to 10) are known in the ArF lithography.

Meanwhile, as the resist pattern becomes finer, high quality of the resist polymer is strictly required. In particular, the method for stable production of the resist polymer which is small in lot-to-lot, reactor-to-reactor and scale-to-scale variations is strongly required. As the commonest method for producing the resist polymer, a so-called batch polymerization method has been known in which basic ingredient monomers, a polymerization initiator and if necessary a chain transfer agent are dissolved in a polymerization solvent and polymerized with heat. However, in the batch polymerization method, it is difficult to control a temperature-rising rate constantly at all times. Therefore, there has been a drawback that difference in amount of generated radical species occurs at a stage of temperature-rising due to subtle variations in the temperature-rising rate and causes lot-to-lot variations in molecular weight distribution. Also, it has been necessary to consider and change a heating condition in order to reproduce the same temperature-rising rate regardless of shape and scale of the reactor. In addition, in the case of batch polymerization method, even if the same temperature-rising rate is reproduced, there has been a drawback that difference of a radical concentration occurs in the temperature-rising process due to batch-to-batch variations in amount of dissolved oxygen, because a trace quantity of radical generated by partial decomposition of the polymerization initiator in the temperature-rising process is trapped by dissolved oxygen in the polymerization solvent. And thus difference easily occurs in weight average molecular weight and molecular weight distribution. Additionally, since there is a period of a low radical concentration and a high monomer concentration in the temperature-rising process in the batch polymerization method, there has been a problem that a trace amount of a high molecular weight component (high polymer) with molecular weight of 100,000 or more generates.

As the polymerization method which is not subject to the temperature-rising rate, the method in which monomers and a chain transfer agent as necessary are dissolved in the polymerization solvent and heated to the polymerization temperature followed by adding a polymerization initiator at a time or in some portions (see e.g., Patent Reference 11) and the method in which the polymerization initiator is added by dropwise over the definite time (see e.g., Patent Reference 12) are known. However, there has been a problem that a trace amount of high polymer generates because the monomer is heated to the polymerization temperature in the absence of the polymerization initiator in these methods.

Also, the method, so-called dropping polymerization method is known, in which the polymerization is carried out by dropping a solution containing monomers, a polymerization initiator and if necessary a chain transfer reagent in the same solvent as the polymerization solvent or different, into the polymerization solvent heated up to the polymerization temperature (see e.g., Patent References 13 to 15). However, there has been a problem that a trace amount of high polymer generates because the monomer is retained in the coexistence with a polymerization initiator during the period of the dropwise addition in this method.

As the method for suppressing the generation of high polymer in a mixed solution of a monomer and a polymerization initiator, the method in which a polymerization inhibitor is added is considered. However, when a large amount of polymerization inhibitor is added to suppress the generation of high polymer, it likely affects the polymerization reaction. In addition, in the ArF lithography, there has been a problem that a phenol type compound such as 4-methoxyphenol generally used as the polymerization inhibitor is left in the polymer and absorbs the light with a wavelength of 193 nm. Besides, according to the study by the present inventors, radical species can be consumed by dissolved oxygen and the generation of high polymer can be suppressed to some extent, by retaining the mixed solution of the monomer and the polymerization initiator under an air atmosphere instead of adding the polymerization inhibitor. But there is a possibility of explosion and fire disaster in this method, which could not be industrially practiced in terms of safety.

When the above high polymer generates, solubility of the obtained resist polymer to a resist solution and an alkali developer becomes poor. Even if the high polymer is dissolved initially, it nucleates and sometimes makes an insoluble foreign substance grow and precipitate in storage with time. It is highly possible that these insoluble matters become a cause of defects of the resist pattern. Thus, it has been strongly desired to provide a resist polymer which does not contain the high polymer and a method for the production thereof.

Patent Reference 1
JP-A-59-45439
Patent Reference 2
JP-A-5-113667
Patent Reference 3
JP-A-7-209868
Patent Reference 4
JP-A-11-65120
Patent Reference 5
JP-A-62-115440.
Patent Reference 6
JP-A-4-219757
Patent Reference 7
JP-A-3-223860
Patent Reference 8
JP-A-4-104251
Patent Reference 9
JP-A-9-73173
Patent Reference 10
JP-A-10-239846
Patent Reference 11
JP-A-2001-109153
Patent Reference 12
JP-A-2002-6501 (Examples)
Patent Reference 13
JP-A-4-269754 (Examples)
Patent Reference 14
JP-A-11-295894
Patent Reference 15
International Publication WO99/50322

SUMMARY OF THE INVENTION

The present invention has been completed against the above background, and the objective thereof is to provide a resist polymer which is small in lot-to-lot, reactor-to-reactor, and scale-to-scale variations, and does not contain a high polymer, is excellent in solubility and storage stability, and is suitable for fine pattern formation in the semiconductor lithography, and a method for the production thereof.

As a result of an intensive study for solving the above problems, the present inventors have found that a monomer can be introduced into a system without being subject to a temperature-rising rate and concurrently it is possible to suppress the generation of a high polymer by introducing a basic ingredient monomer and a polymerization initiator by a particular method in the drop polymerization method, and resist polymer which is excellent in solubility and storage stability is obtained, and have completed the invention.

That is, the present invention provides the resist polymer at least having a repeating unit having a structure which is decomposed by an acid to become soluble in an alkali developer and a repeating unit having a polar group to enhance adhesion to a substrate, characterized in that a peak area of a high molecular weight component (high polymer) with a molecular weight of 100,000 or more is 0.1% or less based on an entire peak area in a molecular weight distribution determined by gel permeation chromatography (GPC).

Also, the present invention provides a method for producing a resist polymer at least having a repeating unit having a structure which is decomposed by an acid to become soluble in an alkali developer and a repeating unit having a polar group to enhance adhesion to a substrate, characterized in that radical copolymerization is performed by retaining a solution containing polymerizable monomers and a solution containing a polymerization initiator in independent storage tanks respectively and supplying them into a polymerization system continuously or intermittently.

Also, present invention provides a method for producing the resist polymer, wherein the solution containing the polymerizable monomers is previously heated before being supplied to polymerization system.

Also, the present invention provides a method for producing the resist polymer, wherein supplying the solution containing the polymerization initiator to polymerization system is started prior to supplying the solution containing the polymerizable monomers.

Further, the present invention provides a method for producing the resist polymer, wherein the solution containing the polymerizable monomers and the solution containing the polymerization initiator are mixed in a polymerization tank by continuously or intermittently supplying from the respectively independent storage tanks into a polymerization solvent heated to polymerization temperature.

Further, the present invention provides a method for producing resist polymer, wherein the solution containing the polymerizable monomers and the solution containing the polymerization initiator are previously mixed just before the polymerization and then continuously or intermittently supplied into the polymerization solvent heated to the polymerization temperature.

Furthermore, the present invention provides a method for producing the resist polymer, wherein supplying rate of either or both of the solution containing the polymerizable monomers and the solution containing the polymerization initiator to polymerization system, is changed by 2 or more steps.

Furthermore, the present invention provides a method for producing the resist polymer, wherein the polymerization is conducted at or above temperature of the boiling point of polymerization solvent.

DETAILED DESCRIPTION OF THE INVENTION

The present invention is described in detail below.

The monomers as the raw material used for the present invention is not limited particularly as long as they are monomers having polymerizable ethylenic double bond in its structure. The resulting resist polymer is comprising at least a repeating unit having a structure which is decomposed by an acid to become soluble in an alkali developer, more specifically, the repeating unit (A) having the structure where a non-polar substituent is eliminated by the acid and a polar group soluble in the alkali developer emerges, and a repeating unit (B) having a polar group to enhance adhesion to a substrate. And if it is necessary, the resist polymer is comprising a repeating unit (C) having a non-polar and acid-stable substituent to regulate the solubility in a resist solvent or the alkali developer.

The structure which is decomposed by the acid to become alkali-soluble in the repeating unit (A) means a conventional structure for resist polymer, and can be obtained by co-polymerization of the monomer having the structure which is decomposed by the acid and becomes alkali-soluble, or by co-polymerization of the monomer having an alkali-soluble polar structure (alkali-soluble group) and followed by protection of the alkali-soluble group by an acid-labil non-polar structure (acid-labil protecting group).

The monomers having the structure which is decomposed by the acid to become alkali-soluble can include compounds having alkali-soluble groups protected by acid-labil protecting groups, and for example, can include compounds having phenolic hydroxyl group, carboxyl group or hydroxylfluoroalkyl group protected by the acid-labil protecting groups.

Therefore, the polymerizable compounds having the alkali-soluble groups can include, specifically for example, hydroxystyrenes such as p-hydroxystyrene, m-hydroxystyrene and p-hydroxy-α-methylstyrene; carboxylic acids having ethylenical double bonds such as acrylic acid, methacrylic acid, trifluoromethylacrylic acid, 5-norbornene-2-carboxylic acid, 2-trifluoromethyl-5-norbornene-2-carboxylic acid and carboxytetracyclo $[4.4.0.1^{2,5}.1^{7,10}]$ dodecyl methacrylate; polymerizable compounds having hydroxyfluoroalkyl groups such as p-(2-hydroxy-1,1,1,3,3,3-hexafluoro-2-propyl) styrene, 2-(4-(2-hydroxy-1,1,1,3,3,3-hexafluoro-2-propyl)cyclohexyl)-1,1,1,3,3,3-hexafluoropropyl acrylate, 2-(4-(2-hydroxy-1,1,1,3,3,3-hexafluoro-2-propyl)cyclohexyl)-1,1,1,3,3,3-hexafluoropropyl trifluoromethylacrylate and 5-(2-hydroxy-1,1,1,3,3,3-hexafluoro-2-propyl) methyl-2-norbornene, and the like.

The acid-labil protecting groups can include saturated hydrocarbon groups such as tert-butyl group, tert-amyl group, 1-methyl-1-cyclopentyl group, 1-ethyl-1-cyclopentyl group, 1-methyl-1-cyclohexyl group, 1-ethyl-1-cyclohexyl group, 2-methyl-2-adamantyl group, 2-ethyl-2-adamantyl group, 2-propyl-2-adamantyl group, 2-(1-adamantyl)-2-propyl group, 8-methyl-8-tricyclo $[5.2.1.0^{2,6}.]$ decanyl group, 8-ethyl-8-tricyclo $[5.2.1.0^{2,6}.]$ decanyl group, 8-methyl-tetracyclo $[4.4.0.1^{2,5}.1^{7,10}]$ dodecanyl group and 8-ethyl-tetracyclo $[4.4.0.1^{2,5}.1^{7,10}]$ dodecanyl group; oxygen-containing hydrocarbon groups such as 1-methoxyethyl group, 1-ethoxyethyl group, 1-isopropoxyethyl group, 1-n-butoxyethyl group, 1-tert-butoxyethyl group, 1-cyclopentyloxyethyl group, 1-cyclohexyloxyethyl group, 1-tricyclo $[5.2.1.0^{2,6}]$ decanyloxyethyl group, methoxymethyl group, ethoxymethyl group, isopropoxymethyl group, n-butoxymethyl group, tert-butoxymethyl group, cyclopentyloxymethyl group, cyclohexyloxymethyl group, tricyclo $[5.2.1.0^{2,6}]$ decanyloxymethyl group and tert-butoxycarbonyl group; and the like.

In the case of the co-polymerization of the monomer having the alkali-soluble and followed by protection of the alkali-soluble group by the acid-labil group, the above compound having the alkali-soluble group can be used for the co-polymerization and the alkali-soluble group can be substituted to the acid-labil protecting group by subsequent reaction under an acid catalyst with the compound capable to give the substituent such as vinyl ethers and haloalkyl ethers which is not dissolved in alkali. The acid catalysts used for the reaction can include p-toluenesulfonic acid, trifluoroacetic acid, strongly acidic cation exchange resin and the like.

At the same time, the monomers which give the repeat unit (B) having the polar group to enhance the adhesion to the substrate can include the compounds having phenolic hydroxyl group, carboxyl group, hydroxyfluoroalkyl group and the like as the polar groups. Specifically the monomers can include, for example, hydroxystyrenes and carboxylic acids having an ethylenic double bond and polymerizable compounds having hydroxyfluoroalkyl group described above as the polymerizable compounds having the alkali-soluble group, and monomers where polar groups are further substituted thereto, and additionally monomers where polar groups are bound to an alicyclic structure such as norbornene ring and tetracyclododecene ring.

As the above polar group introduced in the repeat unit (B), particularly preferable are the substituents comprising a lactone structure, and for example, it is possible to include substituents comprising the lactone structure such as γ-butyrolactone, γ-valerolactone, δ-valerolactone, 1,3-cyclohexanecarbolactone, 2,6-norbornanecarbolactone, 4-oxatricyclo $[5.2.1.0^{2,6}]$ decane-3-one and mevalonic acid δ-lactone. Besides, the polar groups other than the lactone structure can include hydroxyalkyl groups such as hydroxymethyl group, hydroxyethyl group, hydroxypropyl group and 3-hydroxy-1-adamantyl group, and the like.

Further the monomers contained as necessary which give the repeating unit (C) having acid-stable non-polar substituents to regulate solubility in the resist solvent or the alkali developer can include, for example, compounds having substituted or unsubstituted alkyl or aryl groups containing no polar group, and compounds having polar groups protected with non-polar and acid-stable groups, and specifically can include, for example, styrenes such as styrene, α-methylstyrene and p-methylstyrene; ester compounds where acid-stable non-polar groups are substituted to carboxylic acid having an ethylenic double bond such as acrylic acid, methacrylic acid, trifluoromethylacrylic-acid, norbornenecarboxylic acid, 2-trifluoromethylnorbornenecarboxylic acid and carboxytetracyclo $[4.4.0.1^{2,5}.1^{7,10}]$ dodecyl methacrylate; alicyclic hydrocarbon compounds having an ethylenic double bond such as norbornene and tetracyclododecene, and the like. Examples of acid-stable non-polar substituents, which are substituted to the above carboxylic acid and give ester compounds, can include methyl group, ethyl group, cyclopentyl group, cyclohexyl group, isobornyl group, tricyclo $[5.2.1.0^{2,6}]$ decanyl group, 2-adamantyl group, tetracyclo $[4.4.0.1^{2,5}1^{7,10}]$ dodecyl group and the like.

These monomers can be used in mixture with one or two or more types for the respective repeating units (A), (B) and (C), and a composition ratio of the respective repeating units in the obtained resist polymer can be selected within the range in which the performance of resist is not impaired. The composition ratio of the repeating unit (A) is preferably from 10 to 70 mol %, and more preferably from 10 to 60 mol %. And, the composition ratio of the repeating unit (B) is preferably from 30 to 90 mol %, and more preferably from 40 to 90 mol %, but if some monomer units have same polar group, it is preferably 70 mol % or less. Moreover, the composition ratio of the repeating unit (C) is preferably from 0 to 50 mol %, and more preferably from 0 to 40 mol %.

Also, the weight-average molecular weight (Mw) of the resist polymer is preferably in the range of 2,000 to 40,000, more preferably from 3,000 to 30,000, and especially preferably from 4,000 to 25,000. When it is excessively high, the solubility of the resist polymer into the resist solvent or the alkali developer becomes low. When it is excessively low, coating film performance becomes poor.

The polymerization initiator used in the polymerization includes, but is not limited to, for example, azo compounds such as 2,2'-azobisisobutyronitrile, 2,2'-azobis (2-methylbutyronitrile), dimethyl 2,2'-azobis(isobutylate), 1,1'-azobis (cyclohexane-1-carbonitrile) and 4,4'-azobis (4-cyanovaleric acid), and organic peroxide compounds such as didecanoyl peroxide, dilauroyl peroxide, dibenzoyl peroxide, bis(3,5,5-trimethylhexanoyl) peroxide, succinic acid peroxide and tert-butyl peroxy-2-ethylhexanoate. The polymerization initiator may be used either individually or in combination of two or more. The amount of the polymerization initiator can be selected from a broad range depending on types and amounts of the monomers and the chain transfer agent, and polymerization conditions like polymerization temperature and polymerization solvents.

A chain transfer agent may be used in the polymerization, and it is possible to use, for example, thiol compounds such as dodecanethiol, mercaptoethanol, mercaptopropanol, mercaptoacetic acid and mercaptopropionic acid alone or in mixture. The chain transfer agent may be used by dissolving with the monomer in the monomer solution, or may be used by dissolving with the polymerization initiator in the polymerization initiator solution.

Solvents used for the polymerization reaction include the solvent used for the solution containing the monomers, the solvent used for solution containing the polymerization initiator and the solvent put in a reaction container. These are not particularly limited as long as they are the solvents which allow the monomers, the polymerization initiator and the resultant polymer to be dissolved, and may be the same or different from one another. Specific examples can include ketones such as acetone, methyl ethyl ketone and methyl amyl ketone, ethers such as tetrahydrofuran, dioxane, glyme, propylene glycol monomethyl ether, esters such as ethyl acetate and ethyl lactate, etheresters such as propylene glycol methyl ether acetate, lactones such as γ-butyrolactone, and the like, and these can be used alone or in mixture.

The resist polymer of the present invention comprises at least having a repeating unit having a structure which is decomposed by an acid to become soluble in an alkali developer and a repeating unit having a polar group for enhancing adhesion to a substrate, characterized in that a peak area of a high molecular weight component (high polymer) with molecular weight of 100,000 or more is 0.1% or less based on an entire peak area in a molecular weight distribution determined by gel permeation chromatography (GPC). In the resist polymer of the present invention, it is possible to suppress the generation of high polymer which is the high molecular weight component with a molecular weight of 100,000 or more and make the content of high polymer being 0.1% or less, by retaining the solution containing the basic ingredient monomer (hereinafter abbreviated as monomer solution in some cases) and the solution containing the polymerization initiator (hereinafter abbreviated as initiator solution in some cases) both described above in respective independent storage tanks and supplying into the polymerization system continuously or intermittently to perform the radical copolymerization. Here, the content of high polymer can be given as a ratio of a peak area of the high polymer based on an entire peak area in the molecular weight distribution determined by GPC. In the present invention, the molecular weight distribution by GPC was calculated using a refractive index detector (RI) based on a standard curve made by commercially available polystyrene standard samples.

It is more preferable that a concentration of the monomer in the monomer solution and a concentration of the polymerization initiator in the initiator solution which are supplied to the reaction system are high in terms of productivity. Especially, when the monomer and the polymerization initiator are in the form of liquid, it is possible to supply them neat without dissolving into solvent. But when the monomer and the polymerization initiator are in the form of viscous liquid or solid, they should be used after dissolving into solvent. In case where the monomer and the polymerization initiator are used with solvent, if the concentration is excessively high, viscosity of the solutions sometimes becomes high to worsen operationality and the solid monomer or the polymerization initiator sometimes precipitate. Therefore, it is preferable to select the concentrations at which the monomer and the polymerization initiator are thoroughly dissolved and do not precipitate during the dropwise addition in a viscosity range which does not worsen operationality. The specific concentrations vary depending on the combination of a solute and a solvent in each solution, but typically they are prepared such that the sum concentration of total monomers and the concentration of the polymerization initiator are in the range of, for example from 5 to 60% and preferably from 10 to 50% by mass, respectively.

Preparation of the Monomer Solution and the Initiator solution having higher concentration is possible by previously heating the solutions before supplying them to polymerization system, since the solubility of the monomer solution and the initiator solution is improved. However, the initiator solution should be in a temperature range of generally, for example, 50° C. or below, preferably, 40° C. or below, because the polymerization initiator may be decomposed in a high temperature range. On the other hand, the monomer solution should preferably be supplied after being previously heated in a storage tank or just before supplying them to polymerization system by a heat exchanger. This is because when the temperature of the monomer solution is too low, supplied monomer solution in the heated polymerization system is kept at low temperature locally, and the generation of high polymer may occur. Accordingly, the monomer solution may be previously heated in a temperature range of, for example, 25° C. or higher, preferably, 40° C. or higher. It should be noted that when the monomer solution is previously heated in a storage tank, the monomer solution is kept heated for a long term, and the generation of high polymer may occur under high temperature. Accordingly, it is preferred that previous heating may be conducted in a temperature range of, for example, 50° C. or below. When the monomer solution is previously heated just before supplying the same to polymerization system by the heat exchanger, the storage term under high temperature is short, and accordingly, it is possible to heat the monomer solution to higher temperature, e.g., polymerization temperature.

In the present invention, since the monomer solution and the initiator solution are supplied into the polymerization system, i.e., a polymerization solvent previously heated to the polymerization temperature, they are less subject to the temperature-rising rate comparably to the conventional drop polymerization method. Therefore the stable resist polymer is obtained which is small in lot-to-lot, reactor-to-reactor, and scale-to-scale variations. Especially, when the polymerizable monomer solution is previously heated and supplied, temperature deviation in the reaction system is suppressed more efficiently, and the resist polymer having more stable properties is obtained.

An amount of the polymerization solvent put in the reaction container could be a minimum amount or more capable of being stirred. When the initial putting amount is more than needs, it is not preferable because the amount of the monomer solution which can be supplied becomes small and the production efficiency as reduced. Typically, the amount is selected from a volume ratio of 1/20 or more and preferably from the range of about 1/10 to 1/2 based on a final feeding amount (i.e., the sum amount of the initial feeding amount, the monomer solution and the initiator solution).

The polymerization temperature varies depending on boiling points of the polymerization solvents used, a half life of the polymerization initiator and the like. When it is higher than necessary, there is a problem in stability of the monomer and the resist polymer. Thus, the temperature is preferably selected from the range of 60 to 120° C. and more preferably from 70 to 100° C. The polymerization temperature is controlled such that the temperature in the system is not lowered by feeding the monomer solution and the initiator solution, is preferably retained within a setting temperature ±5° C. and especially preferably the setting temperature ±3° C. Incidentally, the local temperature deviation in the reaction system is suppressed more efficiently by, as mentioned above, previously heating the monomer solution before supplying. Also, the temperature deviation in the reaction system may be suppressed by setting the polymerization temperature to the boiling point of the solvent or more, and conducting the reaction under reflux of the solvent.

The monomer solution and the initiator solution may be supplied from respective storage tanks independently to the polymerization tank, or may be supplied by premixing just before the polymerization. A supplying rate of the monomer solution and the initiator solution can be independently set such that resist polymer having the desired molecular weight distribution is obtained. It is also possible to obtain the resist polymer which has the various molecular weight distributions from narrow dispersion to polydispersion with good reproducibility by altering the supplying rate(s) of either or both of two solutions. For example, when the supplying rate of the initiator solution at a first half stage of the reaction is reduced, and the supplying rate of the initiator solution at a second half stage is increased, polymer having relatively low molecular weight is formed at a first half stage (radical concentration is low), and the resist polymer of polydispersion is obtained. The supplying rate(s) of either or both of two solutions may be changed continuously or stepwise, but the supplying rate(s) may preferably be change at least 2 steps or more.

It is possible to keep the constitution and the temperature of the monomer and the concentration of radical in the polymerization system constant by supplying the two solution as slowly as possible. This enables reducing changes in the composition and the molecular weight of the resist polymer generated at an initial phase and a terminal phase of the polymerization. However, when the supplying rate is excessively slow, it takes a long time to feed and the production efficiency becomes poor. Also, deterioration of the monomer solution sometimes becomes problematic for the monomer with low stability. Therefore, the feeding time for each solution is selected from the range of 0.5 to 20 hours and preferably from 1 to 10 hours. An initiation sequence is not especially limited, but it is preferred that the two solutions are fed simultaneously or that the polymerization initiator is fed in advance to avoid the formation of the high polymer. That is, the polymerization initiator is preferably fed in advance to the monomer solution, because certain time is required for the polymerization initiator being decomposed in the polymerization system and generating radicals.

The polymerization reaction is initiated along with the feed of the monomer solution and the polymerization initiator solution and continued, but it is preferred to react the residual unreacted monomer by maturing with keeping the polymerization temperature for a definite time after the completion of feed. A maturing time is selected within 6 hours and preferably in the range of 1 to 4 hours. When the maturing time is excessively long, it is not preferable because the production efficiency per time is reduced and heating history more than needs is given to the polymer.

The resist polymer after the polymerization can be purified by adding the polymer solution to a poor solvent, or a mixed solvent of the poor solvent and a good solvent dropwise to coagulate, and further washing with above solvent if necessary for removing unwanted matters such as residual monomers, oligomers, the polymerization initiator, the chain transfer agent and reaction residues thereof. The poor solvent is not particularly limited as long as it is the solvent in which the resultant copolymer is not dissolved, and for example, it is possible to use water, alcohols such as methanol and isopropanol, saturated hydrocarbons such as hexane and heptane, and the like. The good solvent is not particularly limited as long as it is the solvent in which the monomers, the oligomers, the polymerization initiator, the chain transfer agent and the reaction residues thereof are dissolved, but it is preferred that the good solvent is the same as the polymerization solvent in terms of management of production steps.

The solvent used for purification is comprised in the resist polymer after the purification. Thus, a resist solution is finished by drying under reduced pressure followed by dissolving in a resist solvent, or by distilling off the other solvent under reduced pressure with supplying the resist solvent if necessary after dissolving in the good solvent such as the resist solvent and the polymerization solvent. The resist solvent is not particularly limited as long as it dissolves the resist polymer, but typically selected taking a boiling point, effects on the semiconductor substrate and the other coating films and absorption of radiation used for lithography into consideration. Examples of the resist solvents generally used include the solvents such as propylene glycol methyl ether acetate, ethyl lactate, methyl amyl ketone, γ-butyrolactone and cyclohexanone. The use amount of the resist solvent is not particularly limited, and is typically in the range of 1 to 20 parts by weight based on 1 part by weight of the resist polymer.

A resist composition can be completed by blending in this resist solution a photo acid generator and an acid diffusion control agent such as a nitrogen-containing basic compound capable of suppressing the rate of acid diffusion within parts which are not exposed. As the photo acid generator, it is possible to use those generally used as basic ingredients for the resist such as onium salts, sulfone compounds, sulfonate esters, sulfonimide compounds and disulfonyldiazomethane compounds. Also if necessary, in the resist composition, it is possible to blend other compounds commonly used as additives for the resist such as a dissolution inhibitor, a sensitizer and dyes.

The combination ratio of respective ingredients (excluding the resist solvent) in the resist composition is generally selected from the ranges of 10 to 50% by mass for the polymer concentration, from 0.1 to 10% by mass for the photo acid generator and from 0.001 to 10% by mass for the acid diffusion controlling agent (reminder is solvent).

EXAMPLES

Next, the present invention is further described by following examples, but the invention is not limited to these examples.

In the examples, % which represents a concentration is on the basis of mass unless otherwise defined except the content of high polymer (%: area percent). Quantification of the high polymer in the obtained resist polymer and evaluation of storage stability were performed by the methods shown below.

(1) Quantification Method of High Polymer in Resist Polymer

The high polymer in the resist polymer was quantified by GPC. An analysis condition and the quantification condition are as follows.

Apparatus: GPC 8020 supplied from Tosoh Corporation
Detector: Differential refractive index (RI) detector
Column: KF-804L (3) supplied from Showa Denko K.K.

Sample amount: The obtained polymer solution after the polymerization was sampled and diluted with tetrahydrofuran to prepare the polymer sample solution containing 1% polymer.

Quantification: To GPC, 15 μl of the above sample was applied, and a peak area, Ap of the target polymer was obtained. Then 150 μl of the above sample was applied and a peak area, Ah of the high polymer was obtained. From these results, the content (%) of high polymer in the polymer was calculated on the basis of the following calculation formula.

Content of high polymer(%)=$Ah/\{(Ap\times 10)+Ah\}\times 100$ (2) Evaluation Method of Storage Stability of Resist Polymer The resist polymer, 15% propylene glycol methyl ether acetate solution (hereinafter inscribed as "PGMEA") was prepared, and particles were measured in the solution after storing at room temperature for 3 months.

Apparatus: KS-40B supplied from Rion Co., Ltd.

Evaluation: The case where there were less than 10/ml of foreign matters with particle size of 0.2 μm or more was rendered "AA", the case where there were from 10/ml or more to less than 100/ml was rendered "A", the case where there were from 100/ml or more to less than 1000/ml was rendered "B" and the case where there were more than 1000/ml was rendered "C".

Example 1

Production of Copolymer 1

A monomer solution was prepared by placing 4800 g of methyl ethyl ketone (hereinafter inscribed as "MEK") in a tank kept at a nitrogen atmosphere, and dissolving 2080 g of 5-acryloyloxy-2,6-norbornanecarbolactone (hereinafter inscribed as "NLA") as a repeat unit (B) having a polar group for enhancing adhesion to a semiconductor substrate {hereinafter (B) on a head of the compounds in the examples has the same meaning as this} and 2480 g of 2-ethyl-2-adamantyl methacrylate (hereinafter inscribed as "EAM") as a repeat unit (A) which is decomposed by an acid to become alkali soluble (hereinafter (A) on a head in the compounds in the examples has the same meaning as this). A polymerization initiator was prepared by placing 700 g of MEK and 80 g of azobisisobutyronitrile (hereinafter inscribed as "AIBN") in another container kept at a nitrogen atmosphere and dissolving. Into a polymerization tank kept at the nitrogen atmosphere, 3500 g of MEK was put and the temperature was raised to 80° C. with stirring. Subsequently, the monomer solution and the polymerization initiator solution kept at the temperature of 25 to 30° C. were fed into the polymerization tank kept at 80° C. over 4 hours, respectively. After the completion of feed, the polymerized solution was matured for 2 hours with keeping the polymerization temperature at 80° C., then cooled to room temperature and taken out. Polymer was precipitated from the resulting polymerized solution by dropping in 70 kg of aqueous methanol and filtrated. The resultant wet cake was washed with 70 kg of methanol, filtrated subsequently dissolved in MEK again, and passed through a filter 40QSH supplied from Cuno Incorporated to remove a trace amount of metals. Then, the solvent was replaced by PGMEA with removing MEK by heating under reduced pressure to prepare PGMEA solution containing 15% polymer. The features of the resultant polymer, the content of high polymer and the evaluation results of storage stability of PGMEA solution are shown in Table 1.

Example 2

Production of Copolymer 2 (1)

A monomer solution was prepared by placing 8000 g of MEK in a tank kept at a nitrogen atmosphere and dissolving 2080 g of (B) NLA, 2480 g of (A) EAM and 2220 g of 3-hydroxy-1-adamantyl acrylate (hereinafter inscribed as "HAA"). Also, a polymerization initiator was prepared by placing and dissolving 1000 g of MEK and 110 g of AIBN in another container kept at the nitrogen atmosphere. Into a polymerization tank kept at the nitrogen atmosphere, 5000 g of MEK was put and the temperature was raised to 80° C. with stirring. Subsequently, the monomer solution and the polymerization initiator solution kept at the temperature of 25 to 30° C. were fed into the polymerization tank kept at 80° C. over 4 hours, respectively. After the completion of feed, the polymerized solution was matured for 2 hours with keeping the polymerization temperature at 80° C., then cooled to room temperature and taken out. Polymer was precipitated from the resulting polymerized solution by dropping in 100 kg of aqueous methanol and filtrated. The resultant wet cake was washed with 100 kg of methanol, filtrated subsequently dissolved in MEK again, and passed through a filter 40QSH supplied from Cuno Incorporated to remove a trace amount of metals. Then, the solvent was replaced by PGMEA with removing MEK by heating under reduced pressure to prepare PGMEA solution containing 15% polymer. The features of the resultant polymer, the content of high polymer and the evaluation results of storage stability of PGMEA solution are shown in Table 1.

Example 3

Production of Copolymer 3 (1)

A monomer solution was prepared by placing 7000 g of MEK in a tank kept at a nitrogen atmosphere and dissolving 2220 g of (B) 5-methacryloyloxy-2,6-norbornanecarbolactone (hereinafter inscribed as "NLM"), 2480 g of EAM and 90 g of methacrylic acid. Also, a polymerization initiator was prepared by placing and dissolving 700 g of MEK and 80 g of AIBN in another container kept at the nitrogen atmosphere. Into a polymerization tank kept at the nitrogen atmosphere, 3300 g of MEK was put and the temperature was raised to 80° C. with stirring. Subsequently, the monomer solution and the polymerization initiator solution kept at the temperature of 25 to 30° C. were fed into the polymerization tank kept at 8.0° C. over 4 hours, respectively. After the completion of feed, the polymerized solution was matured for 2 hours with keeping the polymerization temperature at 80° C., then cooled to room temperature and taken out. Polymer was precipitated from the resulting polymerized solution by dropping in 80 kg of aqueous methanol and filtrated. The resultant wet cake was washed with 80 kg of methanol, filtrated subsequently dissolved in MEK again, and passed through a filter 40QSH supplied from Cuno Incorporated to remove a trace amount of metals. Then, the solvent was replaced by PGMEA with removing MEK by heating under reduced pressure to prepare PGMEA solution containing 15% polymer. The features of the resultant polymer, the content of high polymer and the evaluation results of storage stability of PGMEA solution are shown in Table 1.

Example 4

Production of Copolymer 2 (2)

Examples 4 is conducted by polymerizing purifying and preparing the PGMEA solution by the same procedure as that in the example 2, except that the monomer solution is heated just before supplying it to the reaction system by a heat exchanger to 40° C. The features of the resultant polymer, the content of high polymer and the evaluation results of storage stability of PGMEA solution are shown in Table 1.

Example 5

Production of Copolymer 3 (2)

Examples 5 is conducted by polymerizing purifying and preparing the PGMEA solution by the same procedure as that in the example 3, except that the polymerization initiator solution is prepared by changing fed amount of AIBN to 140 g, and; changing fed amount of MEK to 1030 g; and changing supplying rate of the polymerization initiator solution to 0.6 g/min for the first 1 hour and to 6.3 g/min for consequent 3 hours. The features of the resultant polymer, the content of high polymer and the evaluation results of storage stability of PGMEA solution are shown in Table 1.

Example 6

Production of Copolymer 2 (3)

Examples 6 is conducted by polymerizing purifying and preparing the PGMEA solution by the same procedure as that in the example 2, except that supplying period of the polymerization initiator solution is changed to 4.5 hours, and supplying the monomer solution is initiated after 0.5 hours interval of supplying the polymerization initiator solution. The features of the resultant polymer, the content of high polymer and the evaluation results of storage stability of PGMEA solution are shown in Table 1.

Comparative Examples 1 to 3

Comparative examples 1 to 3 were made by polymerizing and preparing the PGMEA solution by the same procedure as that in the examples 1 to 3, except that the monomer solution and the polymerization initiator were kept in a single tank and fed in mixture from the tank. The features of the resultant polymer, the content of high polymer and the evaluation results of storage stability of PGMEA solution are shown in Table 1.

growth of insoluble foreign substances was observed during the storage period. Meanwhile, in the present invention, it is found that no high polymer generates and the resist polymer which is excellent in storage stability is obtained by feeding the polymerizable monomer and the polymerization initiator each independently.

Advantage of the Invention

According to the present invention, since the method is less subject to the temperature-rising rate comparably to the conventional dropping polymerization method, it is possible to obtain the resist polymer which is small in lot-to-lot, reactor-to-reactor and scale-to-scale variations. Concurrently, since no high polymer is included, it is possible to provide resist polymer which is excellent in solubility, in which no growth of insoluble foreign sub-stances is observed in the storage with time, and which is suitable for the formation of stable and fine resist pattern.

What is claimed is:

1. A method for producing a resist polymer having at least one repeating unit having a structure which is decomposed by an acid to become soluble in an alkali developer and a repeating unit having a polar group to enhance adhesion to a substrate, characterized in that radical copolymerization is performed by supplying a solution consisting of polymerizable monomers and a solvent from a first holding tank and supplying a solution consisting of a polymerization initiator and a solvent from a second, independent holding tank into a polymerization solvent preheated to polymerization temperature without monomers in a polymerization reactor continuously or intermittently, the repeating unit having a structure which is decomposed by an acid to become soluble in an alkali developer hereinafter referred to as (A) and, the repeating unit having a polar group to enhance adhesion to the substrate hereinafter referred to as (B), the proportion of the repeating unit (A) comprising 10-70 mol % and the proportion of repeating unit (B) comprising 30-90 mol %, wherein a peak area of a high molecular weight component (high polymer) with a molecular weight of 100,000 Mw or more is 0.1% or less based on an entire peak area in a molecular weight distribution determined by gel permeation chromatography (GPC), and wherein the repeating units (A) having a structure which is decomposed by an acid to become soluble in an alkali

TABLE 1

| | Composition (mol %) | | | | | GPC | | High polymer | | Storage |
| | | | | | | | | Content | | |
| | NLA | NLM | EAM | HAA | MA | Mw | Mw/Mn | (area %) | Mw | stability |
|---|---|---|---|---|---|---|---|---|---|---|
| Example 1 | 49 | — | 51 | — | — | 8,400 | 2.04 | ND | — | A |
| Example 2 | 34 | — | 33 | 33 | — | 10,300 | 1.97 | ND | — | A |
| Example 3 | — | 59 | 36 | — | 5 | 8,000 | 1.61 | ND | — | A |
| Example 4 | 34 | — | 33 | 33 | — | 10,200 | 1.95 | ND | — | AA |
| Example 5 | — | 59 | 36 | — | 5 | 8,000 | 2.03 | ND | — | A |
| Example 6 | 34 | — | 33 | 33 | — | 9,700 | 1.81 | ND | — | AA |
| Comparative example 1 | 50 | — | 50 | — | — | 8,400 | 2.05 | 0.33 | 249,000 | C |
| Comparative example 2 | 33 | — | 33 | 34 | — | 10,400 | 1.95 | 0.58 | 281,000 | C |
| Comparative excample 3 | — | 59 | 36 | — | 5 | 7,900 | 1.63 | 0.26 | 257,000 | C |

As is obvious from these results, the high polymer generated in the conventional method in which the monomer and the polymerization initiator were supplied in mixture, and developer, and the repeating units (B) having a polar group to enhance adhesion to the substrate are further defined as comprising:

general formula 1

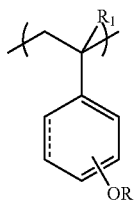

(In the general formula 1, $R_1$ represents a hydrogen atom or a methyl group.)

general formula 2

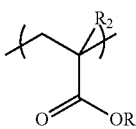

(In the general formula 2, $R_2$ represents a group selected from the group consisting of a hydrogen atom, methyl group or trifluoromethyl group.)

general formula 3

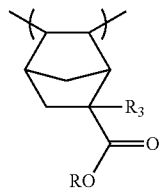

(In the general formula 3, $R_3$ represents a hydrogen atom or a methyl group.)

general formula 4

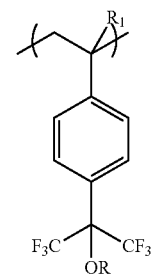

(In the general formula 4, $R_1$ represents a hydrogen atom or a methyl group.)

general formula 5

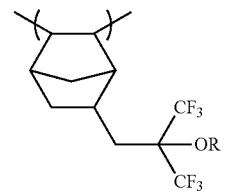

[In the formulas 1-5, R represents an acid labile group selected from following formulas 6-8, or, a polar group selected from formula 9, and when R represents an acid labile group, the formulas 1-5 correspond to the repeating unit (A), and when R represents a polar group, the formulas 1-5 correspond to the repeating unit (B)].)

general formula 6

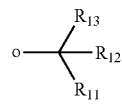

(In the formula, $R_{11}$ represents an alkyl group having 1-2 carbon atoms, $R_{12}$ and $R_{13}$ represents a methyl group or one represents a methyl group and the other represents 1-adamantyl group; or chain or $R_{12}$ and $R_{13}$ represents a signal or bridged alicyclic alkyl group having 5, 6, 10 or 12 carbon atoms formed by bonding each other, and o represents a bonding point with a repeating unit represented by the general formulas 1-5.)

general formula 7

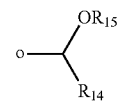

(In the formula, $R_{14}$ represents a methyl group, and $R_{15}$ represents a chain alkyl group having 1-4 carbon atoms, or a alicyclic alkyl group having 6 or 10 carbon atoms, and o represents a bonding point with a repeating unit represented by the general formulas 1-5.)

Formula 8

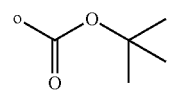

(In the formula, o represents a bonding point with a repeating unit represented by the general formulas 1-5.)

general formula 9

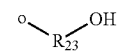

(In the formula, $R_{23}$ represents a bivalent alkyl group having 1-3 carbon atoms or a hydroxyadamantane group and o represents a bonding point with a repeating unit represented by the general formulas 1-5.), with the repeating unit (A) and the repeating unit (B) corresponding to the above general formulas 3 and 5, and with the resist polymer comprising repeating unit (A) and repeating unit (B) corresponding to the above general formulas 3 and 5 derived from monomer having alicyclic double bond, and comprising other repeating units derived from monomer having ethylenic double bond.

* * * * *